United States Patent [19]

Otani et al.

[11] Patent Number: 4,966,508
[45] Date of Patent: Oct. 30, 1990

[54] WORK HOLDING DEVICE FOR CUTTING PRINTED BOARDS

[75] Inventors: Tamio Otani, Hadano; Masao Nishigai, Ayase; Yasuhiko Kanaya, Machida, all of Japan

[73] Assignee: Hitachi Seiko, Ltd., Tokyo, Japan

[21] Appl. No.: 360,132

[22] Filed: Jun. 1, 1989

[30] Foreign Application Priority Data

Jun. 3, 1988 [JP] Japan .............................. 63-73358[U]
Dec. 2, 1988 [JP] Japan ........................... 63-156599[U]

[51] Int. Cl.$^5$ ................................................ B23C 1/06
[52] U.S. Cl. ................................ 409/189; 144/136 R; 409/163
[58] Field of Search ............... 409/137, 178, 184, 189, 409/219, 225, 110; 144/134 A, 134 R, 134 B, 136 R; 408/98, 95, 88; 901/41

[56] References Cited

U.S. PATENT DOCUMENTS

| | | | |
|---|---|---|---|
| 3,587,391 | 6/1971 | Pitts et al. | 409/235 |
| 3,730,634 | 5/1973 | Gerber | 408/88 |
| 4,037,982 | 7/1977 | Clement | 409/137 X |
| 4,251,174 | 2/1981 | Satler | 409/137 |
| 4,304,512 | 12/1981 | Vierstraete | 409/178 X |
| 4,443,141 | 4/1984 | Kosmowski | 409/189 X |
| 4,515,505 | 5/1985 | Frisbie | 409/184 |
| 4,530,627 | 7/1985 | Kosmowski | 409/190 X |
| 4,657,452 | 4/1987 | Astigiano et al. | 409/190 |
| 4,749,314 | 6/1988 | LeBlond | 408/95 X |

FOREIGN PATENT DOCUMENTS

| | | | |
|---|---|---|---|
| 71709 | 5/1982 | Japan | 408/95 |
| 615509 | 12/1984 | Japan | 409/189 |

Primary Examiner—William Briggs
Attorney, Agent, or Firm—Antonelli, Terry, Stout & Kraus

[57] ABSTRACT

A work holding device used in an external form cutting machine for printed boards, the cutting machine including a work mounting table movable in X direction and a cutter mounting spindle movable in Y direction perpendicular to X direction, comprising holding device disposed above the table, pushing device for pushing said holding device, elevating device for raising and lowering said holding device. The holding device and the elevating device engage with each other slidably in a vertical direction with the pushing device interposed therebetween. By virtue of these arrangements, the printed boards are surely holded, resulting in an uniform cutting surface of piled printed boards. Holding pins used in prior arts for holding printed boards are not required, resulting in an improved operational efficiency of the cutting machine.

1 Claim, 4 Drawing Sheets

WORK HOLDING DEVICE FOR CUTTING PRINTED BOARDS

BACKGROUND OF THE INVENTION

The present invention relates to a work holding device used in an external form cutting machine for printed boards.

In an external form cutting process for printed boards, several boards having larger sizes (hereinafter, referred to as a blank board) are piled on each other and together fixed to a base plate, which is provided for protecting a working table, by means of pins, and are together cut into boards each having a precise external form (hereinafter, referred to as printed board). This process is for improving fabrication efficiency. In prior arts such as disclosed in Japanese Utility Model Laid-open No. 61-5509, the cutter is surrounded by an annular brush for sucking and exhausting chips produced in cutting. Further, in the final cutting process where the printed boards are completely separated, the brush and an annular rubber member arranged around the brush are operated for pressing both boards in order to prevent the printed boards from shifting relative to the blank boards. However, in the prior arts, when the cutter starts running at a corner of the printed board for fabrication easiness, less than 25% of the brush or the rubber member 2 presses the printed board 1, as shown in FIG. 4. In consequence, when the printed boards 1 are of a large size, the pressing force to the printed boards 1 is not sufficient, causing the printed boards 1 to deviate from their precise positions and to have external forms different from their precise ones. Although an increased pressing force may be obtained by increasing the size of the rubber member, the rubber member of a large size will deteriorate the operational efficiency of the machine. For solving this problem, in the machine shown in FIG. 4, pins 5 are provided, in addition to the pins for clamping the blank boards 3 on the base plate 4, for fixing the printed board 1 to the base plate 4 and for preventing the printed board 1 from shifting in cutting process. However, the pins 5 are required only in the cutting process, and must be removed from the printed board 1 when the printed board is going to be used.

SUMMARY OF THE INVENTION

The object of the present invention is to provide a work holding device used in an external form cutting machine for printed boards, wherein the pins 5 which are usually used in prior arts for clamping printed boards on a base plate are not required, and there are obtained a uniform and even cutting surface of the piled printed boards and an improved operational efficiency of the cutting machine.

Means for achieving the above-mentioned object according to the present invention is described below by referring to FIG. 1.

A brush 6 is mounted on the lower end of a fitting 7, which is supported by a supporting member 11 slidably in a vertical direction. A spring 12 presses fitting 7 downwards. A cylinder 13 is disposed above a table 14 and capable of moving the supporting member 11 in a vertical direction. A cutter is denoted by numeral 15.

In FIG. 1 and FIG. 3, the position of cutter 15 is position a and the final position thereof is position b of the cutting course. With cutter 15 located at position a, brushes 6 are moved downwards by cylinder 13 and pressed on printed boards 1. In this situation, most portion of the tips of the brushes contact with printed board 1 and press the printed boards through springs 12. Then, a head 22 is moved in Y direction (a direction perpendicular to the paper surface in FIG. 1) until cutter 15 reaches position b, where the printed boards are completely separated. During this process, brushes 6 do not move relative to printed board 1, resulting in no risk to cause any frictional scratch on the surface of printed board 1. Therefore, the pressing force of the brushes can be increased. Further, since most of brushes press printed boards 1, the printed boards do not move during the final cutting process, resulting in a uniform and even cutting surface of the piled printed boards.

DESCRIPTION OF THE PREFERRED EMBODIMENTS

An embodiment of the present invention will be described below by referring to the attached drawings.

Figure 1:
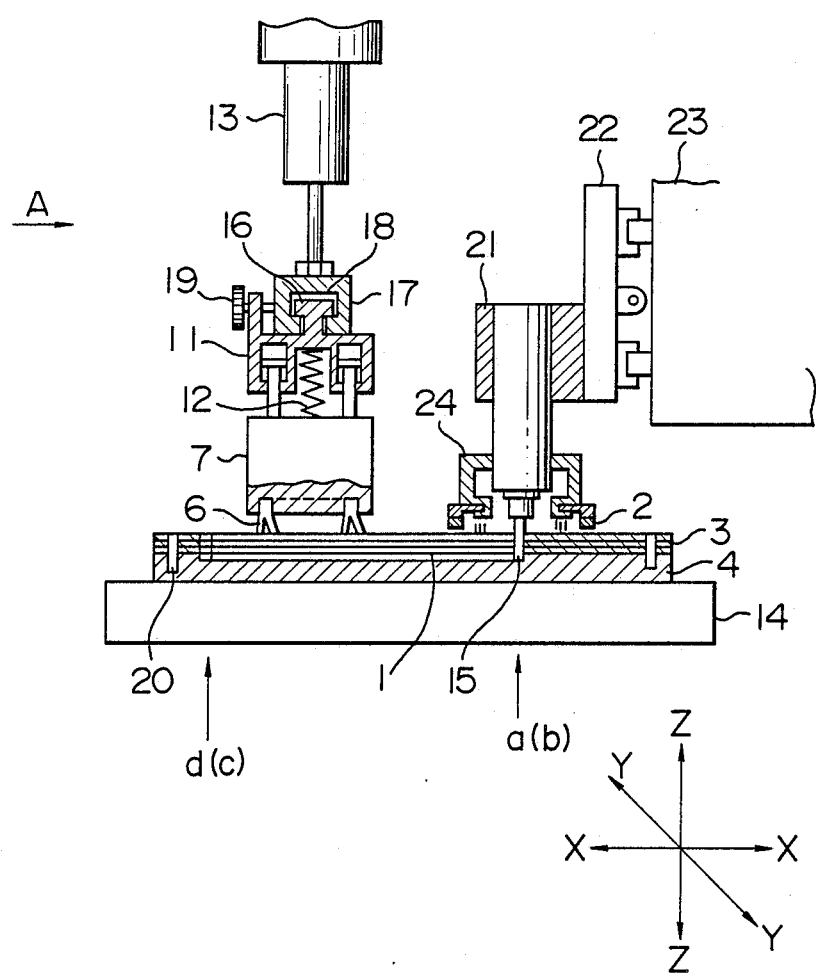
FIG. 1 is a front view of an external form cutting machine provided with a work holding device according to the first embodiment of the present invention.
Figure 2:
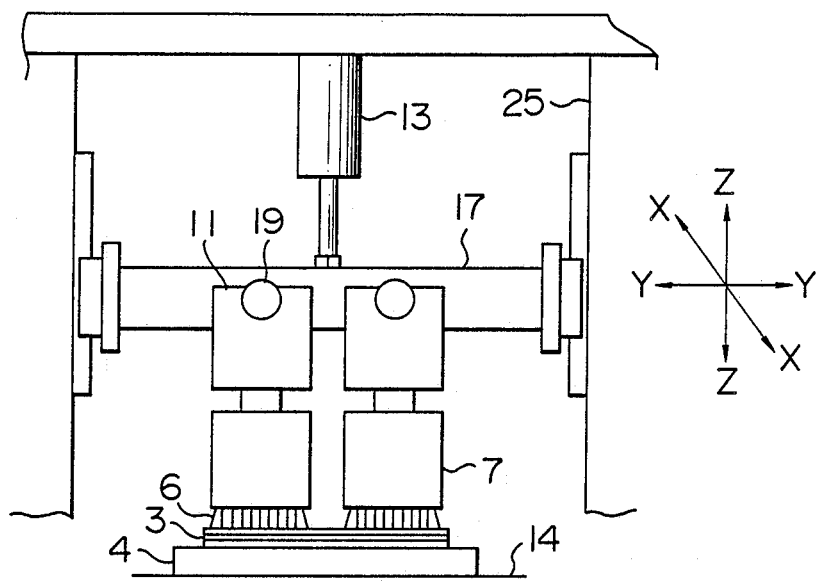
FIG. 2 is a side view of the machine taken in the direction of the arrow A of FIG. 1.

As shown in FIG. 1 and FIG. 2, annular brushes 6 are mounted on the lower ends of fittings 7, which are supported by supporting members 11 slidably in vertical direction (hereinafter, referred to as Z direction). T-shaped projections 16 formed on the tops of supporting members 11 engage with a T-shaped groove 18 formed in a flange 17 which is secured to the tip of cylinder 13. Thus, supporting members 11 are movable in Y direction. Springs 12 press fittings 7 downwards. The positions of supporting members 11 relative to flange 17 are determined by means of bolts 19 which are screwed through supporting members 11. A table 14 is movable in left and right direction (hereinafter, referred to as X direction). Blank boards 3 are fixed integrally to base plate 4 by means of pins 20. A spindle 21 mounts a cutter 15, and is movable in Z direction relative to a head 22. Head 22 is movable in Y direction relative to a machine body 23, which also supports table 14 slidably in X direction. A board pressing device 24 of a prior art is arranged around cutter 15. Plates 25 secured to machine body 23 mount a cylinder 13 and guide the flange 17 in Z direction.

Figure 3:
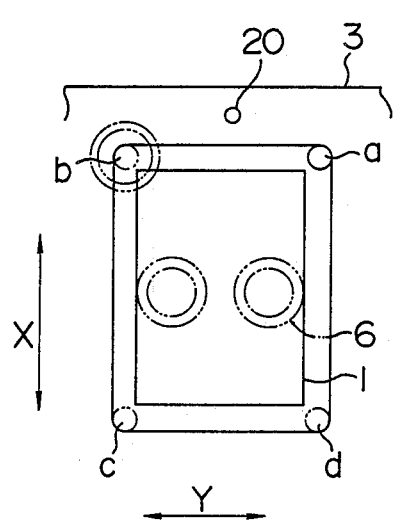
FIG. 3 is a schematic presentation for explaining the function of a device according to the first embodiment of the present invention.
Figure 4:
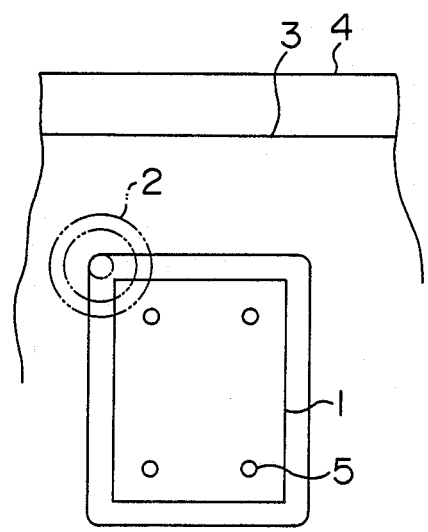
FIG. 4 is a schematic presentation relating to a prior art.

The operation of the cutting machine will be described below by referring to FIG. 3 which shows a cutting path for printed boards 1. Cutter 15 is assumed to start at position b, move through positions c, d, and a, and return to position b.

Cutter 15 is started to rotate by pushing a starting button not shown. Then, spindle 21 is lowered at position b, and cutter 15 starts to drill blank boards 3. With this cutter situation maintained, table 14 is moved in X direction, while the boards are cut along a path from position b to position c. When cutter reaches position c, table 14 is stopped, and head 22 starts to move in Y direction for cutting the boards along a cutting path from position c to position d. When cutter reaches position d, head 22 is stopped, and table 14 starts to move in X direction for cutting the boards along a cutting path from position d to position a. When cutter reaches position a, table 14 is stopped, and brushes 6 are lowered by means of cylinder 13 for pressing printed boards 1. Next, head 22 is moved in Y direction for cutting the boards along the final cutting path from a to b. During this final cutting process, table 14 and brushes 6 are both standing still and only head 22 is moving. When cutter 15 reaches position b, the cutting process is completed and head 22 is stopped. Then, the rotation of cutter 15 is stopped, spindle 21 is raised, and brushes 6 are also raised by means of cylinder 13. When brushes separate from printed board 1, each fitting 7 returns to its lowest position under the force of spring 12.

Figure 5:
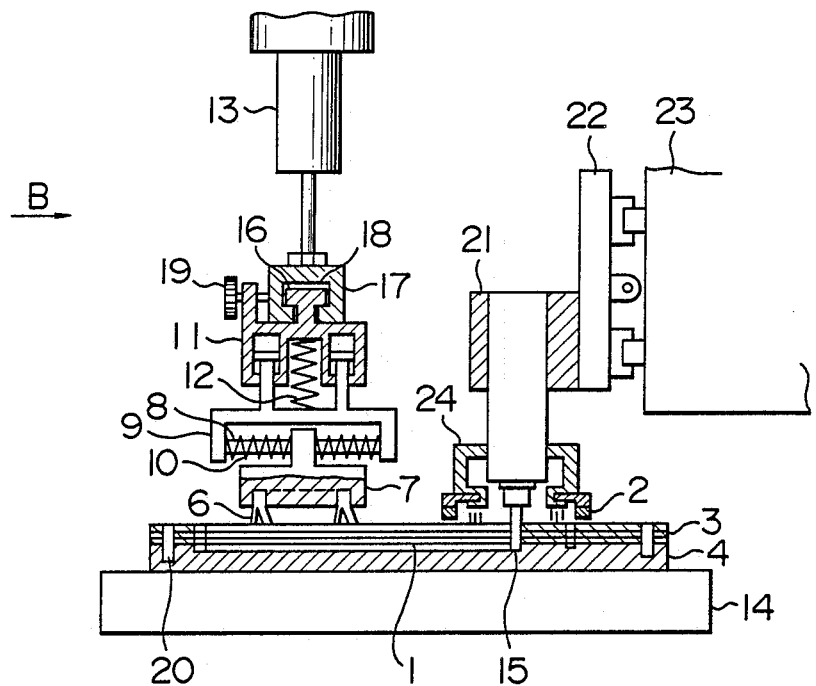
FIG. 5 is a front view of an external form cutting machine provided with a work holding device according to the second embodiment of the present invention.
Figure 6:
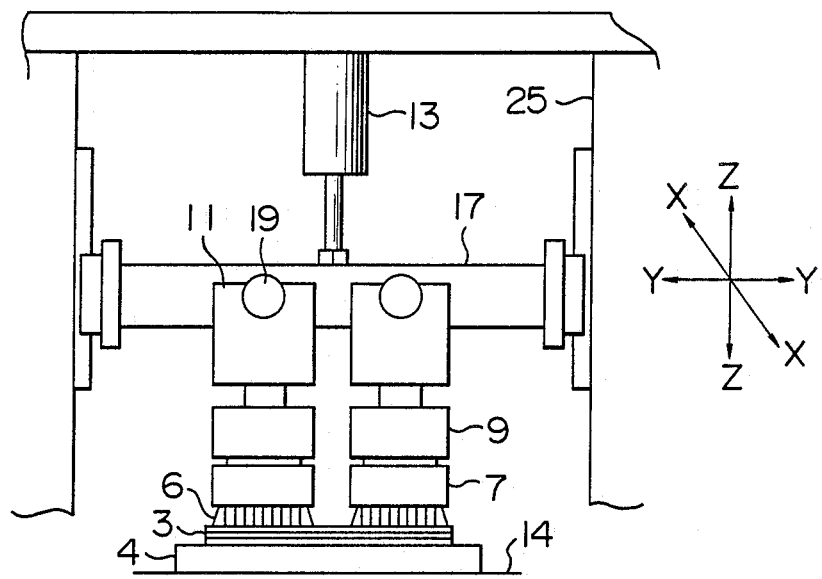
FIG. 6 is a side view of the machine taken in the direction of the arrow B of FIG. 5.
Figure 7:
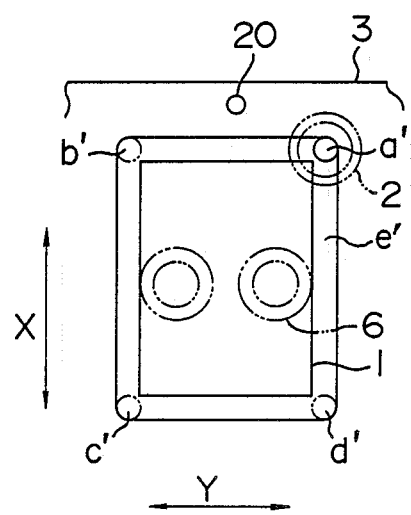
FIG. 7 is a schematic presentation for explaining the function of a device according to the second embodiment of the present invention. Common members seen in FIG. 4 are designated with common numerals.

Second embodiment of the present invention will be described below by referring to FIGS. 5–7.

Annular brushes 6 are attached to the lower ends of fittings 7, similarly to in the first embodiment. A horizontal rod 8 slidably passes through each fitting 7, and supported by a guide 9 at the lower end thereof. Springs 10 are arranged at both sides of fitting 7 for locating the fitting 7 almost at a middle position of guide 9 by the spring forces. Each supporting member 11 supports each guide 9 slidably in vertical direction (hereinafter, referred to as Z direction) at the lower end. A spring 12 presses guide 9 downwards. Arrangement and structures other than those mentioned above are the same as in the first embodiment.

The operation of the cutting machine according to the second embodiment will be described below by referring to FIG. 7 which shows a cutting path for printed boards 1. Cutter 15 is assumed to start at position a', move through positions b', c', and d', and return to position a'.

Cutter is started to rotate by pushing a starting button not shown. Then spindle 21 is lowered at position a', and cutter 15 starts to drill blank boards 3. With this cutter situation maintained, head 22 is moved in Y direction, while the boards are cut along a path from position a' to position b'. When cutter reaches position b', head 22 is stopped, and table 14 starts to move is X direction for cutting the boards along a cutting path from position b' to position c'. When cutter reaches position c', table 14 is stopped, and head 22 starts to move in Y direction for cutting the boards along a cutting path from position c' to position d'. When cutter reaches position d', head 22 is stopped, and then table 14 is moved in X direction. When cutter 15 reaches position e', brushes 6 are lowered by means of cylinder 13 for pressing printed boards 1. Next, table 14 is further moved in X direction for cutting the boards along the final cutting path from e' to a'. During the final cutting process along path e' to a', fitting 7 moves relative to guide 9 along rod 8, thereby making it possible for brushes 6 to move together with printed boards 1 as one unit. When cutter reaches position a', the cutting process is completed and table 14 is stopped. Then, the rotation of cutter 15 is stopped, spindle 21 is raised, and brushes 6 are also raised by means of cylinder 13. When brushes separate from printed board 1, each fitting 7 returns to a position near the center of guide 9 under the force of spring 10.

In case the final cutting path is curved or inclined to Y direction, fitting 7 is required to move, but in case the final cutting path is along Y direction, fitting 7 does not move. Therefore, in the former case, namely both the spindle and the table are moved so as to finally cut the printed boards curvedly, the work holding device in the second embodiment may be applicable specially. In the second embodiment, cylinder 13 is fixed to machine body 23 through plates 25.

Although, in the described embodiments, the work holding device includes two units, each of which is mounted on flange 17 and composed of a brush 6, a supporting member 11, a spring 12 in the first embodiment, while additionally of a rod 8, a guide 9, and springs 10 in the second embodiment, the device may include only one unit, or more than two units. Further, it may be possible to provide a plurality of supporting members 11 and to connect each of the supporting members 11 with a corresponding cylinder 13 for individually operating the brush. Instead of brush, materials such as rubber or sponge, or else, balls or rollers, which are rotatably supported by guide 9, may be used for pressing the printed boards.

As mentioned above in detail, in a work holding device according to the present invention, the printed boards 1 are held, and a uniform and even cutting surface can be obtained without requiring fitting pins 5 which are usually used in prior arts, resulting in an improved operational efficiency.

What is claimed is:

1. A work holding device used in an external form cutting machine for printed boards, said cutting machine including a work mounting table movable in X direction and a cutter mounting spindle movable in Y direction perpendicular to X direction, comprising,
   holding means disposed above a work mounting table of an external form cutting machine for printed boards for holding printed boards on said table,
   pushing means for pushing said holding means in a direction toward printed boards on the table,
   elevating means for raising and lowering said holding means,
   wherein said pushing means is interposed between said holding means and said elevating means and said pushing means includes, guide means for guiding said holding means for sliding movement in a horizontal direction relative to the guide means and positioning means for resiliently positioning the holding means in a predetermined position in the horizontal direction relative to the guide means, said pushing means pushing said holding means in a direction toward printed boards on the table by way of said guide means.

* * * * *